United States Patent
Moriyama

(10) Patent No.: US 9,202,755 B2
(45) Date of Patent: Dec. 1, 2015

(54) CIRCUIT CONNECTING MATERIAL AND SEMICONDUCTOR DEVICE MANUFACTURING METHOD USING SAME

(71) Applicant: DEXERIALS CORPORATION, Tokyo (JP)

(72) Inventor: Hironobu Moriyama, Tochigi (JP)

(73) Assignee: DEXERIALS CORPORATION, Tokyo (JP)

(*) Notice: Subject to any disclaimer, the term of this patent is extended or adjusted under 35 U.S.C. 154(b) by 0 days.

(21) Appl. No.: 14/387,783

(22) PCT Filed: Mar. 6, 2013

(86) PCT No.: PCT/JP2013/056123
§ 371 (c)(1),
(2) Date: Sep. 24, 2014

(87) PCT Pub. No.: WO2013/146141
PCT Pub. Date: Oct. 3, 2013

(65) Prior Publication Data
US 2015/0140738 A1    May 21, 2015

(30) Foreign Application Priority Data

Mar. 30, 2012  (JP) ................................. 2012-079542

(51) Int. Cl.
*H01L 21/00* (2006.01)
*H01L 21/78* (2006.01)
(Continued)

(52) U.S. Cl.
CPC . *H01L 21/78* (2013.01); *C09J 7/00* (2013.01); *H01L 21/563* (2013.01);
(Continued)

(58) Field of Classification Search
CPC ..................... H01L 24/83; H01L 2924/00014; H01L 2924/00; H01L 2224/32225; H01L 21/78; H01L 23/00; H01L 2224/3001
USPC .................. 257/753, 758, E21.503, E23.099, 257/E23.124; 428/1.5; 349/122; 403/272; 438/110, 113
See application file for complete search history.

(56) References Cited

U.S. PATENT DOCUMENTS 5,118,370 A * 6/1992 Ozawa .......................... 156/73.1
6,238,597 B1 * 5/2001 Yim et al. ...................... 252/512
(Continued)

FOREIGN PATENT DOCUMENTS

JP          A-09-283566         10/1997
JP          A-2001-93940        4/2001
(Continued)

OTHER PUBLICATIONS

International Search Report issued in International Patent Application No. PCT/JP2013/056123 dated Jun. 4, 2013 (with translation).

*Primary Examiner* — Caleb Henry
(74) *Attorney, Agent, or Firm* — Oliff PLC

(57) ABSTRACT

Provided are a circuit connecting material able to provide good bonding with an opposing electrode, and a semiconductor device manufacturing method using the same. The present invention uses a circuit connecting material, in which a first adhesive layer to be adhered to the semiconductor chip side, and a second adhesive layer having a lowest melting viscosity attainment temperature higher than that of the first adhesive layer are laminated. When the semiconductor chip on which the circuit connecting material is stuck is mounted on a circuit board, a thickness of the first adhesive layer is within a range satisfying formula (1), thereby providing good bonding with the opposing electrode.

9 Claims, 7 Drawing Sheets

(51) Int. Cl.
*H01L 23/00* (2006.01)
*H01L 21/683* (2006.01)
*H01L 25/065* (2006.01)
*H01L 25/00* (2006.01)
*C09J 7/00* (2006.01)
*H01L 21/56* (2006.01)

(52) U.S. Cl.
CPC ......... *H01L 21/6836* (2013.01); *H01L 24/16* (2013.01); *H01L 24/29* (2013.01); *H01L 24/81* (2013.01); *H01L 24/83* (2013.01); *H01L 25/0657* (2013.01); *H01L 25/50* (2013.01); *C09J 2201/134* (2013.01); *C09J 2201/36* (2013.01); *C09J 2203/326* (2013.01); *H01L 24/11* (2013.01); *H01L 24/13* (2013.01); *H01L 24/27* (2013.01); *H01L 24/32* (2013.01); *H01L 24/73* (2013.01); *H01L 2221/6834* (2013.01); *H01L 2221/68327* (2013.01); *H01L 2221/68377* (2013.01); *H01L 2224/11002* (2013.01); *H01L 2224/13082* (2013.01); *H01L 2224/13111* (2013.01); *H01L 2224/13147* (2013.01); *H01L 2224/16057* (2013.01); *H01L 2224/16145* (2013.01); *H01L 2224/16225* (2013.01); *H01L 2224/27002* (2013.01); *H01L 2224/27436* (2013.01); *H01L 2224/2929* (2013.01); *H01L 2224/29082* (2013.01); *H01L 2224/29386* (2013.01); *H01L 2224/32145* (2013.01); *H01L 2224/32225* (2013.01); *H01L 2224/73104* (2013.01); *H01L 2224/73204* (2013.01); *H01L 2224/81203* (2013.01); *H01L 2224/81204* (2013.01); *H01L 2224/81805* (2013.01); *H01L 2224/81815* (2013.01); *H01L 2224/81855* (2013.01); *H01L 2224/83191* (2013.01); *H01L 2224/83203* (2013.01); *H01L 2224/94* (2013.01); *H01L 2225/06513* (2013.01); *H01L 2924/01322* (2013.01); *H01L 2924/14* (2013.01)

(56) References Cited

U.S. PATENT DOCUMENTS

| | | | |
|---|---|---|---|
| 6,255,138 B1* | 7/2001 | Haishima | 438/119 |
| 6,981,317 B1* | 1/2006 | Nishida | 29/840 |
| 7,081,675 B2* | 7/2006 | Yim et al. | 257/753 |
| 7,087,995 B2* | 8/2006 | Hiatt et al. | 257/737 |
| 7,701,071 B2* | 4/2010 | Watanabe et al. | 257/783 |
| 8,148,204 B2* | 4/2012 | Kaneya et al. | 438/118 |
| 8,419,888 B2* | 4/2013 | Hamazaki | 156/306.6 |
| 8,486,212 B2* | 7/2013 | Hamazaki | 156/228 |
| 8,647,923 B2* | 2/2014 | Sakaguchi et al. | 438/108 |
| 8,758,546 B2* | 6/2014 | Ishigami et al. | 156/323 |
| 2003/0032277 A1* | 2/2003 | Miyasaka | 438/613 |
| 2003/0231276 A1* | 12/2003 | Miki et al. | 349/149 |
| 2004/0080055 A1* | 4/2004 | Jiang | 257/783 |
| 2006/0033213 A1* | 2/2006 | Yim et al. | 257/753 |
| 2007/0170599 A1* | 7/2007 | Amagai et al. | 257/783 |
| 2009/0075429 A1* | 3/2009 | Sato et al. | 438/118 |
| 2010/0230810 A1* | 9/2010 | Kang et al. | 257/737 |
| 2013/0270694 A1* | 10/2013 | Hwang et al. | 257/737 |
| 2014/0346684 A1* | 11/2014 | Kojima | 257/783 |

FOREIGN PATENT DOCUMENTS

| | | |
|---|---|---|
| JP | A-2005-28734 | 2/2005 |
| JP | A-2011-515839 | 5/2011 |

* cited by examiner

CIRCUIT CONNECTING MATERIAL AND SEMICONDUCTOR DEVICE MANUFACTURING METHOD USING SAME

FILED OF THE INVENTION

The present invention relates to a circuit connecting material used for mounting a semiconductor chip, and a semiconductor device manufacturing method using the same. This application claims priority to Japanese Patent Application No. 2012-079542 filed on Mar. 30, 2012, the entire contents of which are incorporated by reference herein.

BACKGROUND OF THE INVENTION

Recently, in a semiconductor chip mounting method on a substrate, it has currently been under consideration of using, for the purpose of shortening process, "prior supply type underfill film" in which an underfill film is stuck on a substrate, prior to metallic bonding or pressure welding bonding of a semiconductor Integrated Circuit (IC) electrode and a substrate electrode.

The mounting method utilizing the prior supply type underfill film is, for example, effectuated as in the flowing (see, for example, Patent Document 1).

The method involves:

Step A: laminating an underfill film to a wafer and dicing the wafer to fabricate a semiconductor chip;

Step B: positioning the semiconductor chip on the substrate; and

Step C: pressure bonding the semiconductor chip and the substrate, under high temperature and high pressure, to ensure secure conduction by metallic bonding of a solder bump, and adhering the semiconductor chip to the substrate by a curing action of the underfill film.

Regarding such a mounting method, Patent Document 2 proposes, for example, enhancing wettability of a solder and improving a bonding state thereof by using an adhesive having a flux effect.

However, the conventional underfill film entails a problem that a solder wet spreads to a solder-adhered electrode side, and precludes the film from providing good bonding with an opposing electrode.

PRIOR ART DOCUMENT

Patent Document

PLT1: Japanese Patent Application Laid-Open No. 2005-28734

PLT2: Japanese Patent Application Laid-Open No. 2001-93940

SUMMARY OF THE INVENTION

The present invention is proposed in view of such actual circumstances the prior art intrinsically has, and an object of the present invention is to provide a circuit connecting material capable of providing good bonding with an opposing electrode, and a semiconductor device manufacturing method using the same.

In order to solve the aforementioned problem, the present invention provides a circuit connecting material for bonding a semiconductor chip in which a solder-adhered electrode is formed and a circuit board on which an opposing electrode opposite to the solder-adhered electrode is formed, wherein a first adhesive layer to be bonded to the semiconductor chip side, and a second adhesive layer having a lowest melting viscosity attainment temperature higher than that of the first adhesive layer are laminated, and when the semiconductor chip on which the circuit connecting material is stuck is mounted on the circuit board, at a temperature lower than the lowest melting viscosity attainment temperature of the first adhesive layer, a thickness Hb1 of the first adhesive layer is within a range satisfying the following formula (1):

$$0.5 \times He1 \leq Hb1 \leq He1 + 0.75 \times Hs \qquad \text{formula (1)}$$

where He1 denotes an electrode thickness of the solder-adhered electrode, and Hs denotes a solder thickness of the solder-adhered electrode.

Further, the present invention provides a semiconductor device manufacturing method for bonding a semiconductor chip in which a solder-adhered electrode is formed to a circuit board on which an opposing electrode opposite to the solder-adhered electrode is formed via a circuit connecting material in which a first adhesive layer to be adhered to the semiconductor chip side, and a second adhesive layer having a lowest melting viscosity attainment temperature higher than that of the first adhesive layer are laminated, the method comprises: a mounting step of mounting the semiconductor chip in which the circuit connecting material is stuck on the circuit board, at a temperature lower than a lowest melting viscosity attainment temperature of the first adhesive layer, a thickness Hb1 of the first adhesive layer being within a range satisfying the following formula (1); and a thermo compression bonding step of thermo compression bonding the semiconductor chip and the circuit board, at a temperature higher than a melting point of a solder of the solder-adhered electrode, $$0.5 \times He1 \leq Hb1 \leq He1 + 0.75 \times Hs \qquad \text{formula (1)}$$

where He1 denotes an electrode thickness of the solder-adhered electrode, and Hs denotes a solder thickness of the solder-adhered electrode.

Moreover, the present invention provides a semiconductor device manufacturing method for bonding a plurality of chip substrates having a first surface on which a solder-adhered electrode is formed, and a second surface on which an opposing electrode opposite to the solder-adhered electrode is formed are laminated via a circuit connecting material in which a first adhesive layer to be adhered to the first surface side, and a second adhesive layer having a lowest melting viscosity attainment temperature higher than that of the first adhesive layer are laminated, wherein the method comprises: a mounting step of mounting a first surface of a first chip substrate on which the circuit connecting material is stuck on a second surface of a second chip substrate, at a temperature lower than the lowest melting viscosity attainment temperature of the first adhesive layer, a thickness Hb1 of the first adhesive layer being within a range satisfying the following formula (1); and a thermo compression bonding step of thermo compression bonding the first surface of the first chip substrate and the second surface of the second chip substrate, at a temperature higher than a melting point of a solder of the solder-adhered electrode.

$$0.5 \times He1 \leq Hb1 \leq He1 + 0.75 \times Hs \qquad \text{formula (1)}$$

where He1 denotes an electrode thickness of the solder-adhered electrode, and Hs denotes a solder thickness of the solder-adhered electrode.

Advantageous Effect of the Invention

According to the present invention, since a lowest melting viscosity attainment temperature of the first adhesive layer is lower than that of the second adhesive layer, and the circuit connecting material is used, in which an interface formed between the first adhesive layer and the second adhesive layer is at a predetermined position during mounting, the invention prevents a solder from wet spreading to the solder-adhered electrode side, and simultaneously permits the solder to be wet spreading to the opposing electrode side, thus providing good bonding with the opposing electrode.

DETAILED DESCRIPTION OF THE INVENTION

Figure 1:
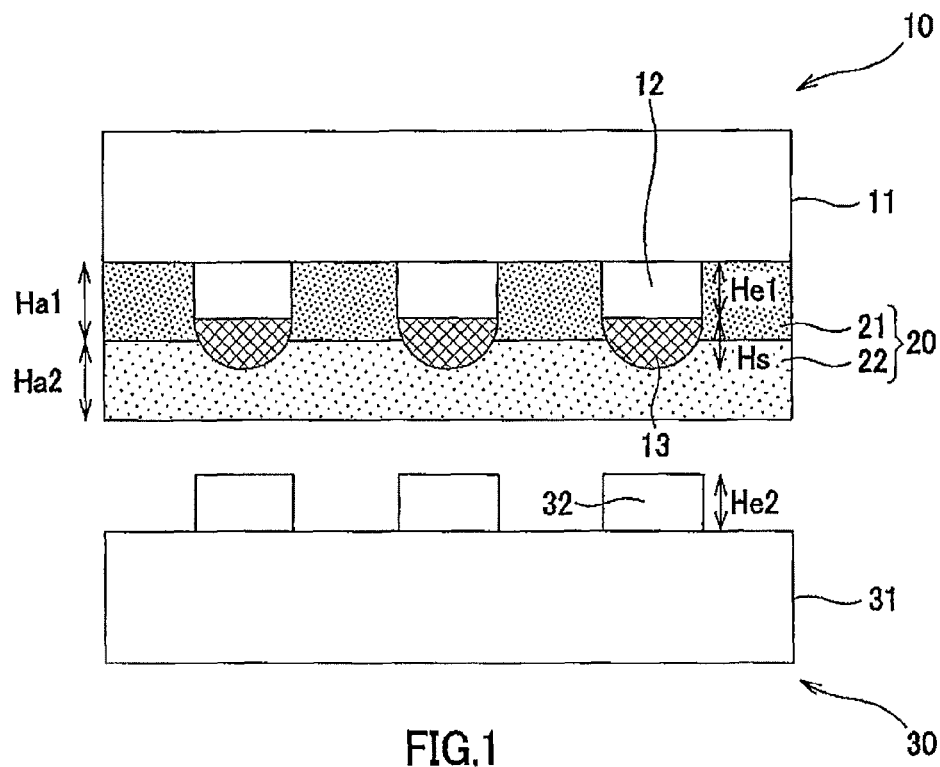
FIG. 1 is a cross-sectional view schematically showing a semiconductor chip before mounting.
Figure 2:
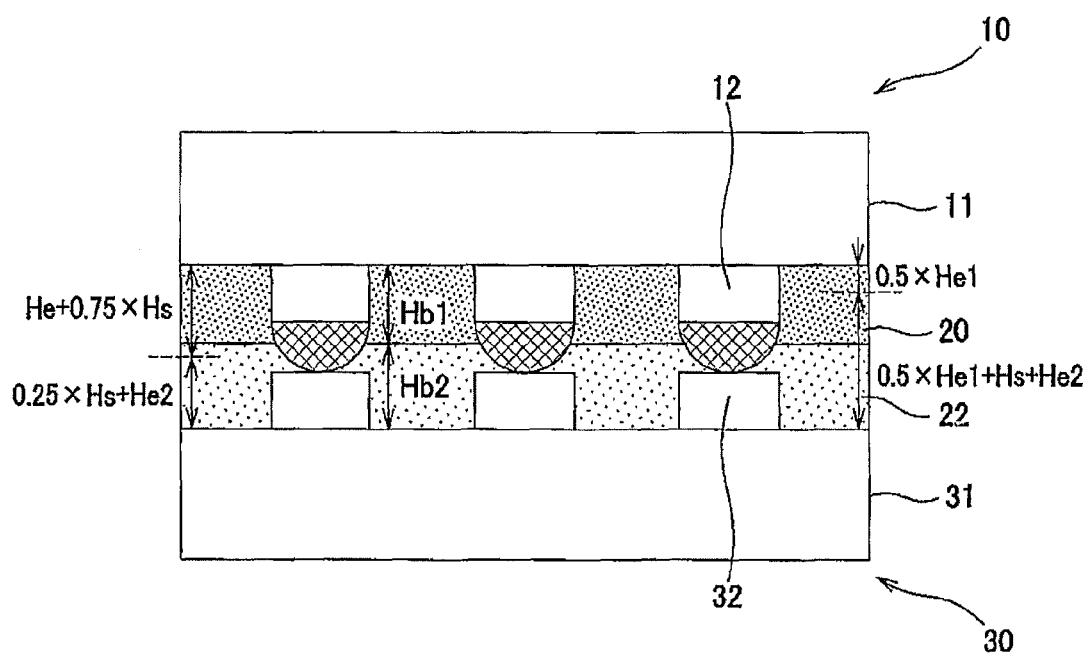
FIG. 2 is a cross-sectional view schematically showing a semiconductor chip after mounting.

Hereinafter, embodiments of the present invention will be described in detail in the following order.
1. Circuit connecting material
2. Semiconductor device manufacturing method
3. Examples 1. Circuit Connecting Material FIG. 1 is a cross-sectional view schematically showing a semiconductor chip before mounting. FIG. 2 is a cross-sectional view schematically showing a semiconductor chip after mounting.

As shown in FIGS. 1 and 2, a circuit connecting material 20 of the present embodiment is used for bonding a semiconductor chip 10, in which a solder-adhered electrode is formed, to a circuit substrate 30 on which an opposing electrode opposite to the solder-adhered electrode is formed.

The semiconductor chip 10 has an integrated circuit formed on a surface of a semiconductor 11 made, such as, of silicone, and has a solder-adhered electrode for connection, called as a vamp. The solder-adhered electrode is formed by bonding a solder 13 on an electrode 12 made of copper, or the like, and has a thickness ($He_1+Hs$) obtained by finding the sum of a thickness $He_1$ of the electrode 12 and a thickness $Hs$ of the solder 13.

As a solder, a Sn-37Pb eutectic solder (melting point: 183 degrees C.), a Sn—Bi solder (melting point 139 degrees C.), Sn-3.5Ag (melting point 221 degrees C.), Sn-3.0Ag-0.5Cu (melting point 217 degrees C.), and Sn-5.0Sb (melting point 240 degrees C.), or the like are available.

Electronic circuits are formed on a base material 31, for example, such as a rigid substrate and a flexible substrate to fabricate the circuit board 30. Further, in a mounting portion on which the semiconductor chip 10 is mounted, an opposing electrode 32 having a predetermined thickness $He_2$ is formed, at a position opposite to the solder-adhered electrode of the semiconductor chip 10.

The circuit connecting material 20 has a double structure where a first adhesive layer 21 to be adhered to the semiconductor chip 10 side, and a second adhesive layer 22 having a lowest melting viscosity attainment temperature T2 higher than a lowest melting viscosity attainment temperature T1 of the first adhesive layer 21 are layered.

Herein, the lowest melting viscosity attainment temperatures T1, T2 (T1<T2) of the first adhesive layer 21 and the second adhesive layer 22 are higher than a normal temperature and lower than a solder melting point (25 degrees C.<T1, T2<solder melting point).

As shown in FIG. 2, when the semiconductor chip 10 to which the circuit connecting material 20 is stuck is mounted on a circuit board 30, at a temperature lower than the lowest melting viscosity attainment temperature T1 of the first adhesive layer 21, a thickness $Hb_1$ of the first adhesive layer 21 is within a range satisfying the following formula (1).

$$0.5 \times He_1 \le Hb_1 \le He_1 + 0.75 \times Hs \qquad \text{formula (1)}$$

Where $He_1$ denotes an electrode thickness of the solder-adhered electrode, and $Hs$ denotes a solder thickness of solder-adhered electrode.

The circuit connecting material 20 of this kind has a characteristic that the lowest melting viscosity attainment temperature T1 of the first adhesive layer 21 is lower than the lowest melting viscosity attainment temperature T2 of the second adhesive layer 22, and that an interface $Hb_1$ formed between the first adhesive layer 21 and the second adhesive layer 22 is within a range satisfying the formula (1). This prevents a solder from wet spreading to the solder-adhered electrode side, and simultaneously permits the solder to be wet spreading to the opposing electrode 32 side, thus providing good bonding with the opposing electrode 32.

As shown in FIG. 2, when the semiconductor chip 10 is mounted on the circuit board, it is more preferable for the thickness $Hb_1$ of the first adhesive layer 21 to be within a range satisfying the following formula (2).

$$0.75 \times He_1 \le Hb_1 \le He_1 + 0.75 \times Hs \qquad \text{formula (2)}$$

Where $He_1$ denotes an electrode thickness of the solder-adhered electrode, and $Hs$ denotes a solder thickness of the solder-adhered electrode.

An interface $Hb_1$ formed between the first adhesive layer 21 and the second adhesive layer 22 is within a range satisfying the formula (2), which further prevents a solder from wet spreading to the solder-adhered electrode side, thus allowing the solder to be fully wet spreading to the opposing electrode 32 side.

A position of the interface formed between the first adhesive layer 21 and the second adhesive layer 22, during mounting of the semiconductor chip 10, varies depending on what melting viscosity the first adhesive layer 21 and the second adhesive layer 22 have, at a mounting temperature. Thus, it enables determination of the thickness $Ha_1$ of the first adhesive layer 21, before mounting, based on the melting viscosity, at the mounting temperature.

Specifically, at a temperature at which the semiconductor chip 10 is mounted on the circuit board 30, if a ratio ($\eta_1/\eta_2$) between melting viscosity $\eta_1$ of the first adhesive layer 21 and melting viscosity $\eta_2$ of the second adhesive layer 22 is 0.8 or more, it is preferable for a thickness Ha1 of the first adhesive layer 21 and a thickness Ha2 of the second adhesive layer 22, before mounting, to satisfy the following formulae (3-1) and (3-2).

$$0.5 \times He1 \leq Ha1 \leq He1 + 0.75 \times Hs \quad \text{formula (3-1)}$$

$$He1 + He2 \leq Ha1 + Ha2 \quad \text{formula (3-2)}$$

Where He1 denotes an electrode thickness of the solder-adhered electrode, Hs denotes a solder thickness of the solder-adhered electrode, and He2 denotes an electrode thickness of the opposing electrode.

If melting viscosity ratio ($\eta 1/\eta 2$), at a mounting temperature, is 0.8 or more, it shows a small change between the thickness Ha1 of the first adhesive layer 21 before mounting and the thickness Hb1 of the first adhesive layer 21 after mounting. For this reason, setting the thickness Ha1 of the first adhesive layer 21 and the thickness Ha2 of the second adhesive layer 22, before mounting, to be within a range satisfying the above formulae (3-1) and (3-2) enables the interface Hb1, after mounting, to be limited within a range satisfying the formula (1).

Otherwise, at a temperature at which the semiconductor chip 10 is mounted on the circuit board 30, if the ratio ($\eta 1/\eta 2$) between the melting viscosity i11 of the first adhesive layer 21 and melting viscosity $\eta 2$ of the second adhesive layer 22 is 0.6 or less, it is preferable for the thickness Ha1 of the first adhesive layer 21 and the thickness Ha2 of the second adhesive layer 22, before mounting, to be within a range satisfying the following formulae (4-1) to (4-3).

$$0.5 \times He1 \leq Ha1 \quad \text{formula (4-1)}$$

$$0.25 \times Hs + He2 \leq Ha2 \leq 0.5 \times He1 + Hs + He2 \quad \text{formula (4-2)}$$

$$He1 + He2 \leq Ha1 + Ha2 \quad \text{formula (4-3)}$$

Where He1 denotes an electrode thickness of the solder-adhered electrode, Hs denotes a solder thickness of the solder-adhered electrode, and He2 denotes an electrode thickness of the opposing electrode.

Still otherwise, if the melting viscosity ratio ($\eta 1/\eta 2$), at the mounting temperature, is 0.6 or less, it shows a small change between the thickness Ha2 of the second adhesive layer 22, before mounting, and the thickness Hb2 of the second adhesive layer 22, after mounting. For this reason, setting the thickness Ha2 of the second adhesive layer 22, before mounting, to be within a range satisfying the above formulae (4-1) to (4-3) enables the interface Hb1, after mounting, to be limited within a range satisfying the formula (1).

Figure 3:
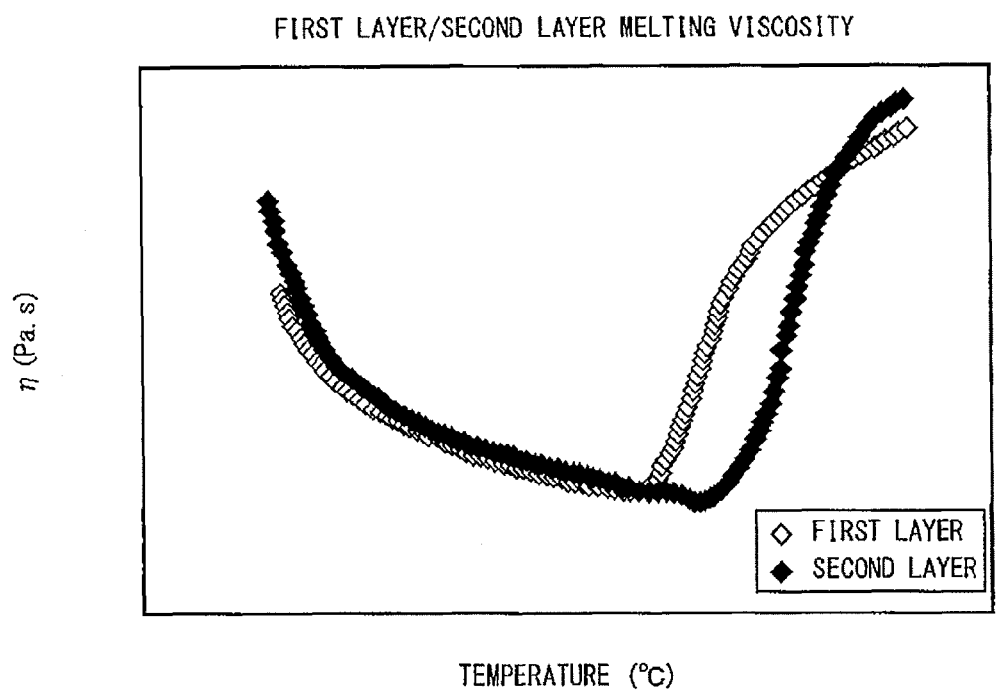
FIG. 3 is a graph depicting an example of melting viscosity of a first adhesive layer and a second adhesive layer.
Figure 4:
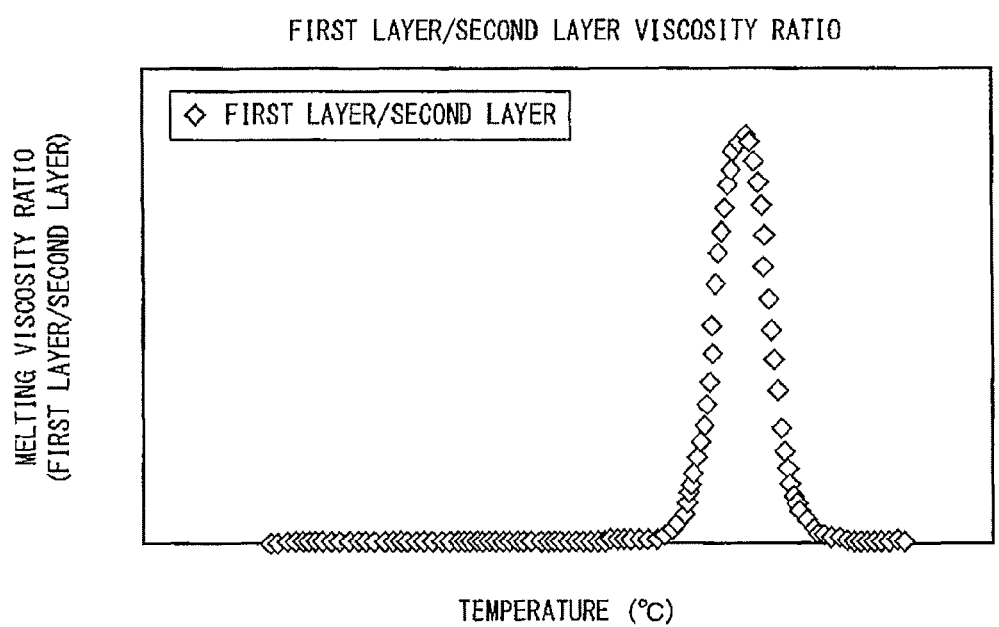
FIG. 4 is a graph depicting melting viscosity ratio (first layer/second layer) of the melting viscosity shown in FIG. 3.

FIG. 3 is a graph showing an example of melting viscosity of the first adhesive layer and the second adhesive layer. Further, FIG. 4 is a graph showing a melting viscosity ratio (first layer/second layer) in a state of the melting viscosity shown in FIG. 3.

It is preferable for melting viscosity of the first adhesive layer 21 and the second adhesive layer 22 to be 100 Pa·s or more and 50000 Pa·s or less. In addition, it is also preferable for a maximum value of a melting viscosity ratio of the first adhesive layer 21 and the second adhesive layer 22 to be 10 or more. This improves wettability of a solder, during thermo compression bonding, thereby providing a more good bonding state.

Next, a description will be made to the first adhesive layer 21 and the second adhesive layer 22 of the circuit connecting material 20. Hereupon, the both of the first adhesive layer 21 and the second adhesive layer 22 contain a film formation resin, an epoxy resin, and an epoxy curing agent.

The film formation resin corresponds to a polymeric resin whose average molecular weight is 10000 or more, and is preferable to have an average molecular weight of 10000 to 80000 or so from point of view film forming. As the film formation resin, one can make use of various resins, such as a phenoxy resin, an epoxy resin, a modified epoxy resin, and a urethane resin, or the like. These film formation resins may be used only one species or be used more than two species in combination. Among other things, in the present embodiment, the phenoxy resin is preferably used from the perspective of a film formation state and connection reliability, or the like.

The epoxy resin includes, for example, a dicyclopentadiene-type epoxy resin, a glycidyl ether-type epoxy resin, glycidyl amine-type epoxy resin, a bisphenol A-type epoxy resin, a bisphenol F-type epoxy resin, a bisphenol S-type epoxy resin, a spiro ring-type epoxy resin, a naphthalene-type epoxy resin, a biphenyl-type epoxy resin, a terpene-type epoxy resin, a tetrablom bisphenol A-type epoxy resin, a cresol novolak-type epoxy resin, a phenol novolak-type epoxy resin, α-naphtol novolak-type epoxy resin, a brominated phenol novolak-type epoxy resin, or the like. These epoxy resins may be used only one species or be used more than two species in combination. Among other things, in the present embodiment, the dicyclopentadiene-type epoxy resin is preferably used from the perspective of high adhesiveness and heat resistance.

No limitation is imposed on the epoxy curing agent, but it is preferable to use acid annhydride with a flux function of removing an oxide film on a solder surface. The acid anhydride includes, for example, aliphatic acid anhydride, such as tetrapropenyl succinic anhydride, dodecenyl succinic anhydride; alicyclic acid anhydride, such as hexahydro phthalic anhydride, methyltetrahydro phthalic anhydride; and aromatic acid anhydraide, such as phthallic acid anhtdrate, trimellitic anhydride, pyromellitic anhydride. These epoxy curing agents may be used only one species or be used more than two species in combination. Among other things, the aliphatic acid anhydride is preferably used from the perspective of solderability.

The epoxy curing agent should be blended as much as the effective amount enough for curing. Too few blending tends to be insufficient solder wettability and conversely too much blending tends to be lowered preservation stability. When the aliphatic acid anhydride is used as an epoxy curing agent, it is preferable to be 15 parts by mass or more and 90 parts by mass or less with respect to 100 parts by weight of the epoxy resin, more preferably to be 40 parts by mass or more and 70 parts by mass or less.

Alternatively, the epoxy curing agent may contain a curing accelerator, if necessary. A specific example of the curing accelerator includes tertiary amines, such as 1,8-diazabicyclo (5,4,0) undecene-7 salt (DBU salt), and 2-(dimethylaminomethyl) phenol, or the like; imidazoles, such as 2-methylimidazole, 2-ethyleimidazole, and 2-etyl-4-methylimidazol; phosfines, such as triphenylphosphine; and metallic compounds, such as tin octylate. Moreover, 0.1 to 5.0 parts by mass of the curing agent is blended with respect to 100 parts by weight of the epoxy resin, if necessary.

The both of the first adhesive layer 21 and the second adhesive layer 22 are preferable to further contain acrylic acid and radical polymerization initiator, in addition to the film formation resin, the epoxy resin, and the epoxy curing agent. This avoids the generation of void even when these layers are rapidly heated, in which a difference between a mounting temperature and a highest attainment temperature, during pressure bonding, is 70 degrees C. or more.

As an acrylic resin, monofunctional (meta) acrylate, and (meta) acrylate more than bifunction may be used. The monofunctional (meta) acrylate includes methyl(meta) acrylate, ethyl(meta) acrylate, n-propyl(meta) acrylate, i-propyl(meta) acrylate, and n-butyl(meta) acrylate, or the like. The (meta) acrylate more than bifunction includes bisphenol F-EO modified di(meta) acrylate, trimethylol propane PO modified (meta) acrylate, and multifunctional urethane (meta) acrylate, or the like. These acrylic resins may be used only one species or be used more than two species in combination. Among other things, in the present embodiment, the bifunctional (meta) acrylate is preferably used.

As radical polymerization initiator, radical precursor such as organic peroxide can preferably be used. The organic peroxide includes, for example, peroxy ester, peroxy ketal, hydroperoxide, dialkyl peroxide, diacyl peroxide, and peroxydicarbonate, or the like. This organic peroxide may be used only one species or be used more than two species in combination. Among other things, in the present embodiment, the peroxy ester is preferably used.

Further, as another additive composition, it is preferable to contain an inorganic filler. Containing the inorganic filler allows the fluidity of a resin layer, during pressure bonding, to be controlled, which improves rates of particle capture. The inorganic filler includes silica, talc, titanium oxide, calcium carbonate, and magnesium oxide, or the like may be used.

Furthermore, silane coupling agents, such as epoxy, amino, mercapto-sulfide, ureide, or the like may be added, if necessary.

A description will then be made to a manufacturing method for prior supply type underfill film in which the aforementioned circuit connecting material is formed in a film shape. The manufacturing method for the circuit connecting material of the present embodiment is for sticking the first adhesive layer 21 and the second adhesive layer 22.

Specifically, the present embodiment includes a step of fabricating the first adhesive layer 21; a step of fabricating the second adhesive layer 22; and a step of sticking the first adhesive layer 21 and the second adhesive layer 22.

In the step of fabricating the first adhesive layer 21, an adhesive composition containing a film formation resin, an epoxy resin, and an epoxy curing agent is dissolved into a solvent. As a solvent, toluene and ethyl acetate, or a mixed solvent thereof may be used. After preparation of a resin composition of the first adhesive layer 21, the resin composition is coated on a peeled base material by means of a bar coater and a coating apparatus, or the like.

The peeled base material is made up, for example, of a layered structure where a remover, such as silicone, or the like is coated to Poly Ethylene Terephthalate (PET), Oriented Polypropylene (OPP), Poly-4-methylpentene-1 (PMP), and Polytetrafluoroethylene (PTFE), or the like. The peeled base material is dedicated to drying of the composition and retains a shape of the compound.

Then, the resin composition coated on the peeled base material is dried utilizing a heat oven, a heating and drying device, or the like. This fabricates the first adhesive layer 21 having a thickness of 5 to 50 μm or so.

In the step of fabricating the second adhesive layer 22, an adhesive composition containing a film formation resin, an epoxy resin, and an epoxy curing agent is dissolved into a solvent, as with the first adhesive layer 21. After a resin composition of the second adhesive layer 22 is prepared, the resin composition is coated on the peeled base material and the solvent is volatilized so that the second adhesive layer 22 is fabricated.

In the step of sticking the first adhesive layer 21 and the second adhesive layer 22, the first adhesive layer 21 and the second adhesive layer 22 are stuck and laminated to fabricate a prior supply type underfill film having a double structure.

Thus, sticking the first adhesive layer 21 and the second adhesive layer 22 allows the prior supply type underfill film having the double structure to be fabricated.

While in the aforementioned embodiments, the prior supply type underfill film having the double structure is fabricated by sticking the first adhesive layer 21 and the second adhesive layer 22, the present embodiment is not necessarily limited thereto. Alternatively, the prior supply type underfill film may be fabricated by forming one adhesive layer, and then coating thereon a resin composition of the other adhesive layer, followed by drying the formation.

2. Semiconductor Device Manufacturing Method

A description will then be made to a semiconductor device manufacturing method by using the aforementioned prior supply type underfill film.

Figure 5:
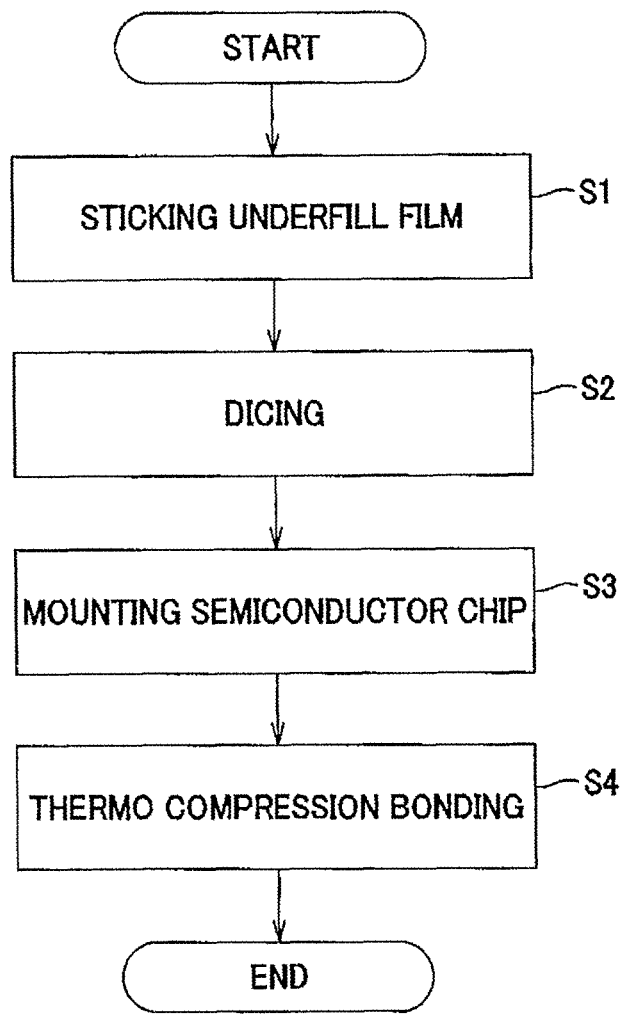
FIG. 5 is a flow chart showing a semiconductor device manufacturing method according to the present embodiment.

FIG. 5 is a flow chart showing a semiconductor device manufacturing method of the present embodiment. As shown in FIG. 5, the semiconductor device manufacturing method of the present embodiment includes an underfill film sticking step S1; a dicing step S2; a semiconductor chip mounting step S3; and a thermo compression bonding step S4.

Figure 6:
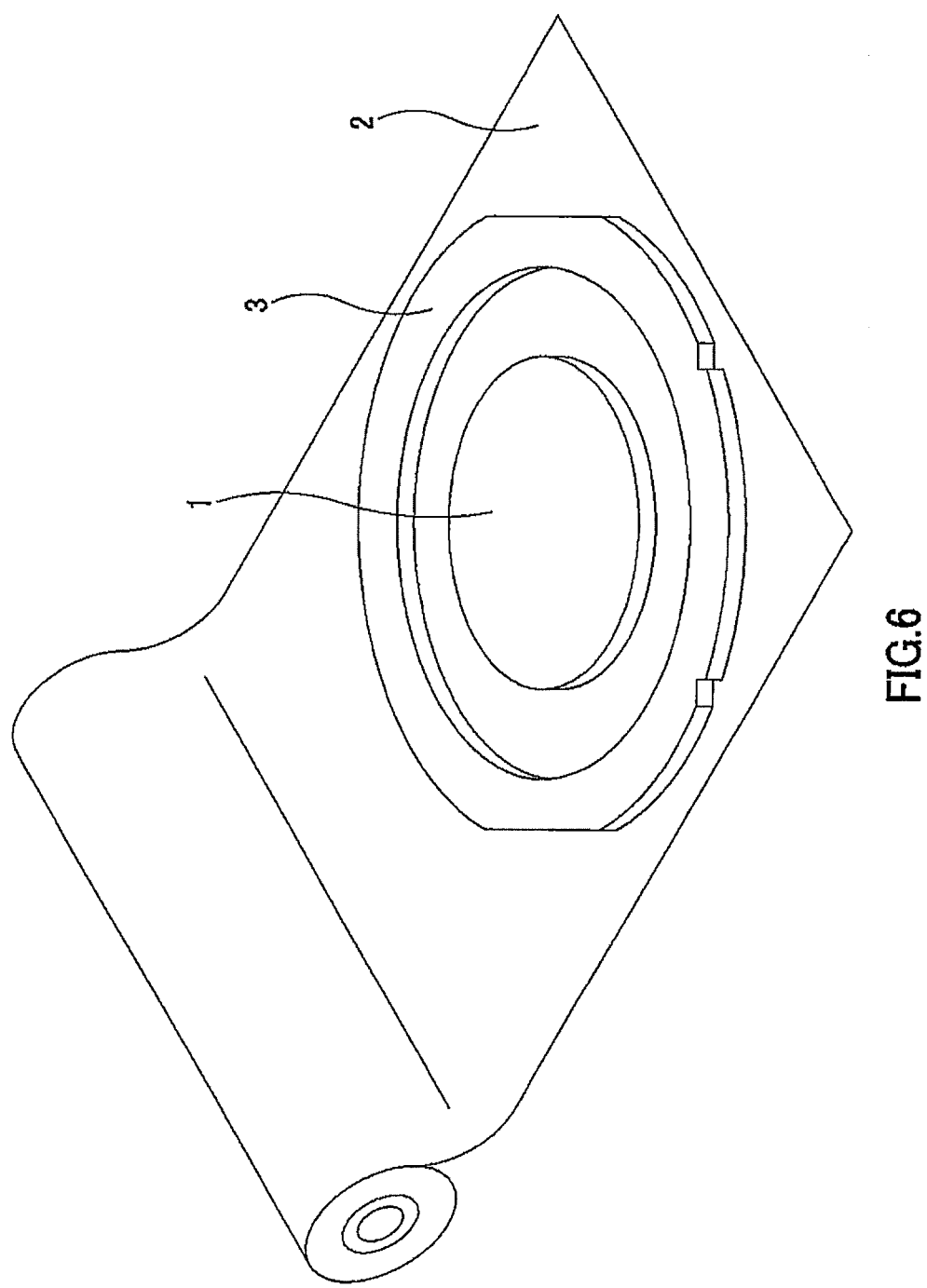
FIG. 6 a perspective view schematically showing a step of sticking an underfill film on a wafer.

FIG. 6 is a perspective view schematically showing a step of sticking an underfill film on a wafer. As shown in FIG. 6, in the underfill film sticking step S1, a wafer 1 is fixed by a jig 3 having a ring-shaped or a frame-shaped frame whose diameter is larger than that of the wafer 1, and an underfill film 2 is stuck on the wafer 1. The underfill film 2 plays a role of protecting and securing the wafer 1, during dicing of the wafer 1, and serves as a dicing tape to hold the wafer 1 during picking up of a diced wafer. Note that a large number of Integrated Circuits (IC) are made in the wafer 1 and solder-adhered electrodes are provided on an adhesive surface of the wafer 1, every semiconductor chip 10 segmented by a scribe line, as shown in FIG. 1.

Figure 7:
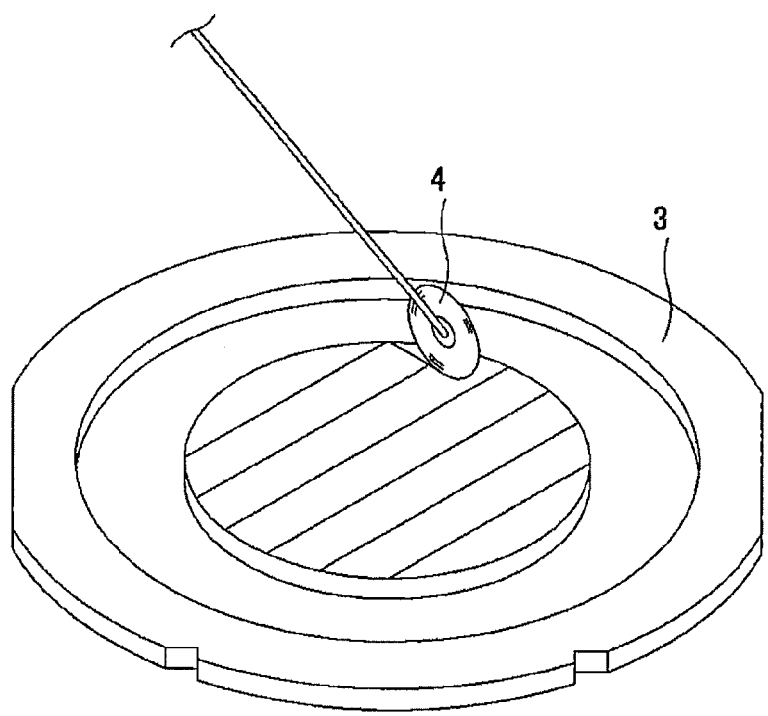
FIG. 7 is a perspective view schematically showing a step of dicing a wafer.

FIG. 7 is a perspective view schematically showing a step of dicing the wafer. As shown in FIG. 7, in the dicing step S2, the wafer 1 is cut by pressing a blade 4 on the wafer 1 along the scribe line to cut the wafer 1 into individual semiconductor chips.

Figure 8:
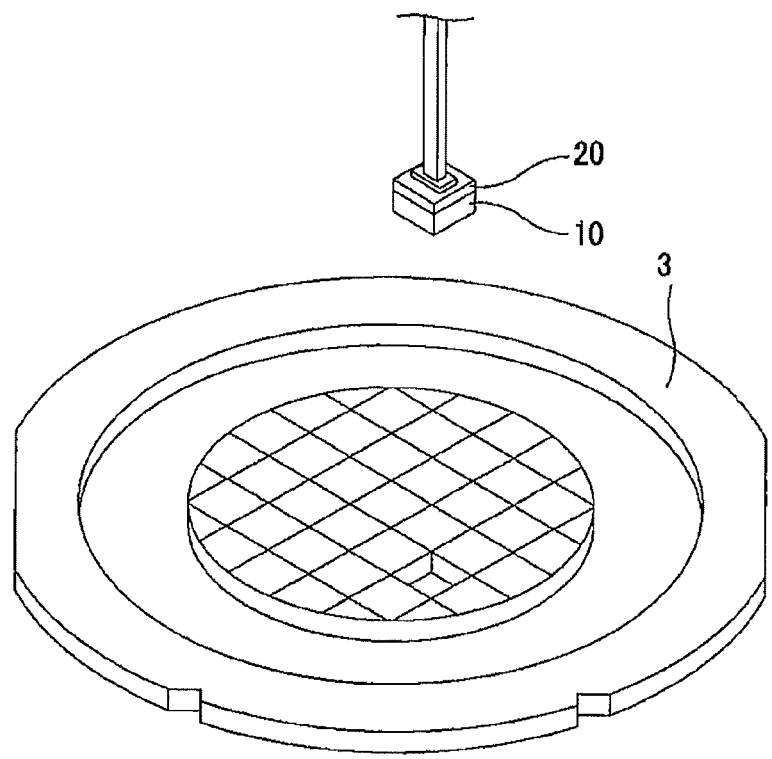
FIG. 8 is a perspective view schematically showing a step of picking up a semiconductor chip.

FIG. 8 is a perspective view schematically showing a step of picking up a diced semiconductor chip. As shown in FIG. 8, each semiconductor chip 10 with an underfill film is picked up by being held with the underfill film.

Figure 9:
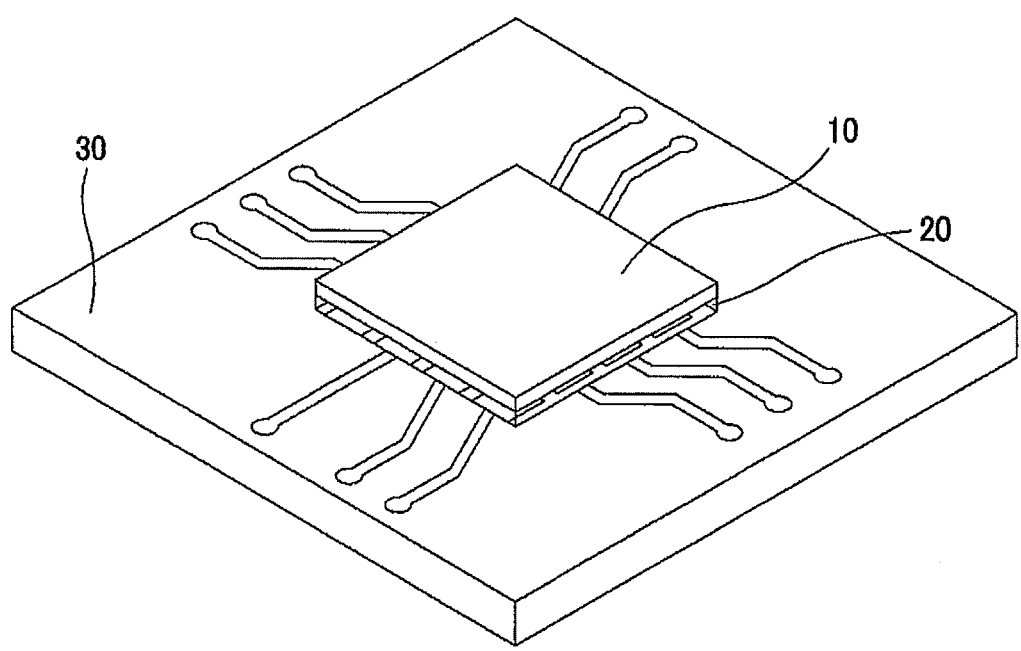
FIG. 9 is a perspective view schematically showing a step of mounting a semiconductor chip on a substrate.

FIG. 9 is a perspective view schematically showing a step of mounting a semiconductor chip on the substrate. The circuit board 30 is, for example, a rigid board or a flexible board. In a mounting portion on which the semiconductor chip 10 is mounted, an electrode is formed, which is conductively connected to a solder-adhered electrode of the semiconductor chip 10.

As shown in FIG. 9, in the semiconductor chip mounting step S3, the semiconductor chip 10 with an underfill film is placed on the circuit board 30 via the underfill film. Further, the semiconductor chip 10 with the underfill film is positioned with the solder-adhered electrode and the opposing electrode 32 being opposed to each other.

The semiconductor chip 10 and the circuit board 30 are press heated, for mounting, with a heat bonder, under the conditions of predetermined temperature, pressure, and time under which fluidity occurs in the underfill film but complete cure does not occur. It is preferable for a temperature condition, during mounting, to be 60 degrees C. or more and 150 degrees C. or less, more preferably 80 degrees C. or more and 120 degrees C. or less. Further, it is preferable for a pressure condition to be 10 N or less, more preferably 8 N or less. Moreover, it is preferable for a time condition to be 1 sec or more and 120 sec or less, more preferably 5 sec or more and 60 sec or less. This puts the solder-adhered electrode into a state where the solder-adhered electrode contacts an electrode of the circuit substrate 30 side without being melted, thereby causing the underfill film to be in an incompletely-cured state. Additionally, because the underfill film is fixed at a low temperature, the generation of void is suppressed, which reduces damage to the semiconductor chip 10.

In the next thermo compression bonding step S4, a solder of the solder-adhered electrode is melted, at a high temperature, to form metallic bonding and an underfill film is completely cured. It is preferable for a temperature condition, during thermo compression bonding, to be 200 degrees C. or more and 280 degrees C. or less, more preferably 220 degrees C. or more and 260 degrees C. or less, even though the temperature varies depending on what type of solder is. Moreover, it is preferable for a time condition to be 5 sec or more and 500 sec or less, more preferably 10 sec or more and 100 sec or less. This creates metal bonding of the solder-adhered electrode and the substrate electrode and causes the underfill film to be completely cured, thereby electrically and mechanically connecting an electrode of the semiconductor chip 10 to that of the circuit board 30.

Thus, since the semiconductor device manufacturing method of the present embodiment uses the circuit connecting material in which a lowest melting viscosity attainment temperature of the first adhesive layer 21 is lower than that of the second adhesive layer 22, and whose interface lies at a predetermined position, during mounting of the semiconductor chip 10, the embodiment prevents a solder from wet spreading to the solder-adhered electrode side, and simultaneously permits the solder to be wet spreading to the opposing electrode, thus providing good bonding with the opposing electrode.

Alternatively, whereas in the aforementioned embodiments, the underfill film acts as a dicing tape, not necessarily limited thereto, flip chip mounting may be allowed using an underfill film after dicing, by separately using a dicing tape.
[Another Embodiment]

This technology can also be applied to the Through Silicon Via (TSV) technology in which a plurality of chip substrates stacked in a sandwich-like manner are electrically connected by filling a metal into a small hole formed in the semiconductor chip.

Put differently, this technology can also be applied to a manufacturing method of semiconductor device in which a plurality of chip substrates having a first surface on which a solder-adhered electrode is formed and a second surface on which an opposing electrode opposite to the solder-adhered electrode is formed are laminated.

In this instance, the circuit connecting material is fabricated as in the following. That is, the first adhesive layer shall be adhered to the first surface side, and a first surface of the first chip substrate to which the circuit connecting material is stuck is mounted on a second surface of the second chip substrate, at a temperature lower than a lowest melting viscosity attainment temperature of the first adhesive layer. A thickness $Hb1$ of the first adhesive layer shall be within a range satisfying the following formula (1).

$$0.5 \times He1 \leq Hb1 \leq He1 + 0.75 \times Hs \quad \text{formula (1)}$$

Where $He1$ denotes an electrode thickness of the solder-adhered electrode, and $Hs$ denotes a solder thickness of the solder-adhered electrode.

After that, the first surface of the first chip substrate is thermo compression bonded to the second surface of the second chip substrate, at a temperature higher than a melting point of a solder of the solder-adhered electrode, thereby providing a semiconductor device in which a plurality of chip substrates are laminated.

EXAMPLES

3. Examples

Hereinafter, a description will be made to Examples of the present invention. In the present Example, Non Conductive Film (NCF)-A to NCF-E was fabricated whose thickness, lowest melting viscosity attainment temperature, and melting viscosity at a mounting temperature or the like were different from one another. By using this, a circuit connecting material having a double structure was fabricated in which the first adhesive layer and the second adhesive layer were laminated was fabricated. Then, an IC chip having the solder-adhered electrode was connected to an IC substrate having an opposing electrode opposing thereto by using the circuit connecting material, to fabricate mounting bodies. A Temperature Cycling Test (TCT) was conducted for each mounting body to evaluate wettability, conduction resistance, and void. Note that the present invention is not necessarily limited thereto.

A measurement of a lowest viscosity attainment temperature and melting viscosity at a mounting temperature, a temperature cycling test, evaluations of wettability, conduction resistance, and void were conducted as in the following.
[Measurement of a Lowest Melting Viscosity Attainment Temperature and Melting Viscosity at Mounting Temperature]

For each NCF, a lowest melting viscosity attainment temperature of a sample and melting viscosity thereof at a mounting temperature were measured, under the conditions of 5 degrees C/min and 1 Hz by means of a rheometer (ARES, made by TA Instruments—Waters LLC).
[Temperature Cycling Test (TCT)]

For each mounting body, a temperature cycling test was conducted, by 2000 cycles, at a temperature of −55 degrees C. (30 min) ⇔ 125 degrees C. (30 min).
[Evaluation of Wettability]

Figure 10:
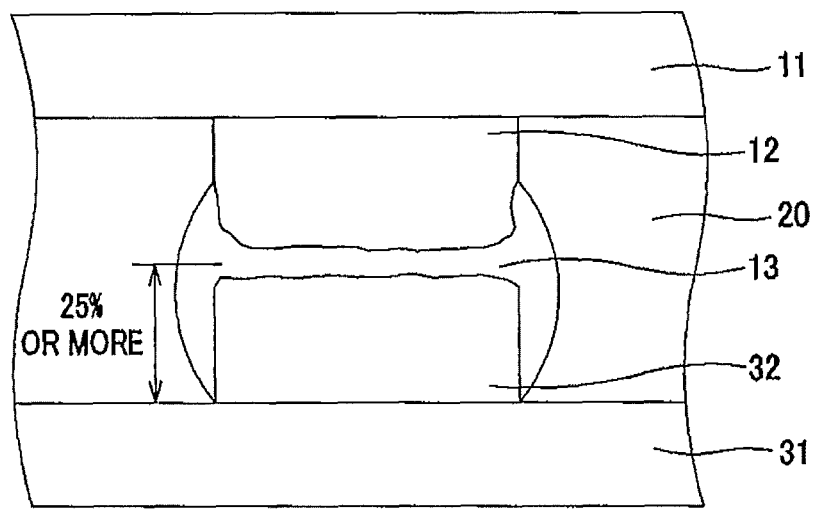
FIG. 10 is a schematic view of a cross section in a state where a solder shows sufficient wettability.
Figure 11:
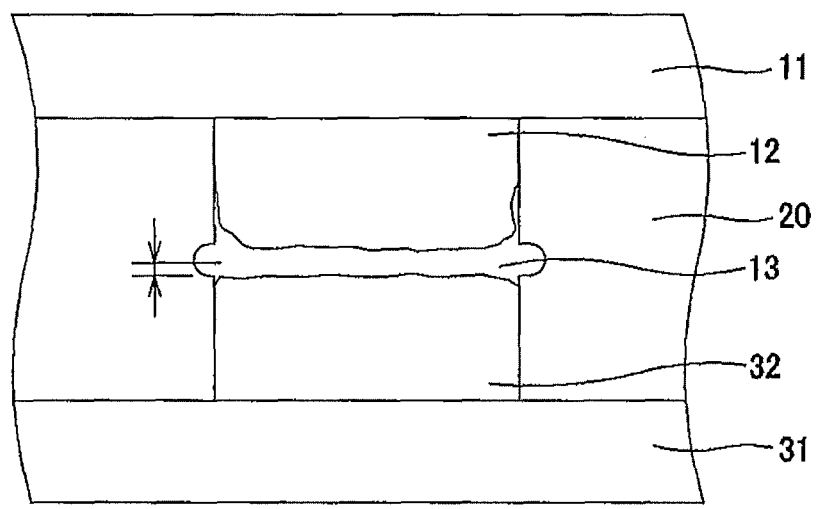
FIG. 11 is schematic view showing a cross section in a state where a solder shows insufficient wettability.

Each mounting body was cut and its cross section was grinded. Subsequently, a wet spread state of a solder between the solder-adhered electrode and the opposing electrode was observed by the Scanning Electron Microscope (SEM), as in a cross-sectional view shown in FIGS. 10 and 11. As shown in FIG. 10, the observation results were indicated by marking. That is, a mounting body whose wet spread distance of a solder to the opposing electrode was 25% or more was marked by ⊚, a mounting body whose wet spread distance was 10% or more and less than 25% was marked by ○, as shown in FIG. 10, and a mounting body whose wet spread distance was less than 10% was marked by X, as shown in FIG. 11.
[Evaluation of Conduction Resistance]

For each mounting body, a conduction resistance value was measured for each of 280 pins by means of a digital multimeter after the Temperature Cycling Test (TCT). The evaluation results were indicated by marking. That is, a mounting body which was not open was marked by ⊚, and a mounting body which was not open more than 1 was marked by X.

[Evaluation of Void]

For each mounting body, an observation was made by means of the Scanning Acoustic Tomograph (SAT). The observation results were indicated by marking. That is, a mounting body which had never a one void was marked by ⊚, a mounting body which had void accounting for 10% or less of an IC chip area was marked by ○, and a mounting body which had void accounting for over 10% of an IC chip area was marked by X.

<Fabrication of NCF>

(NCF-A)

13.7 parts by mass of phenoxy resin (product name: PKHH, made by Union Carbide Corporation); 13.7 parts by mass of epoxy resin (product name: HP7200H, made by DIC Corporation); 8.1 parts by mass of acid anhydride (product name: MH-700, made by New Japan Chemical Co., Ltd.); 0.07 parts by mass of imidazole (product name: 2MZ-A, made by SHIKOKU CHEMICALS CORPORATION); 13.7 parts by mass of acrylic resin (product name: DCP, made by Shin-Nakamura Chemical Co., Ltd.); 0.7 parts by mass of organic peroxide (product name: Perbutyl Z, made by NOF Corporation); 44.6 parts by mass of filler (product name: SO-E5, made by Admatechs Company Limited); 5.5 parts by mass of filler (product name: Aerosil RY200, made by Nippon Aerosil Co., Ltd.) were blended to prepare a resin composition of NCF-A. The resin composition was coated on Polyethylene Terephthalate (PET), which was subject to peeling, by a bar coater, and dried for 3 minutes, in an oven, at a temperature of 80 degrees C. Thereby, NCF-A having a predetermined thickness (cover peeled PET [25 μm]/NCF/base peeled PET [50 μm]) was fabricated. As shown in Table 1, a lowest melting viscosity attainment temperature of NCF-A was 118 degrees C. Further, melting viscosity at a mounting temperature was 1500 Pa·s.

(NCF-B)

13.7 parts by mass of phenoxy resin (product name: PKHH, made by Union Carbide Corporation); 22.7 parts by mass of epoxy resin (product name: HP7200H, made by DIC Corporation); 13.4 parts by mass of acid anhydride (product name: MH-700, made by New Japan Chemical Co., Ltd.); 0.11 parts by mass of imidazole (product name: 2MZ-A, made by SHIKOKU CHEMICALS CORPORATION); 44.6 parts by mass of filler (product name: SO-E2, made by Admatechs Company Limited); 5.5 parts by mass of filler (product name: Aerosil RY200, made by Nippon Aerosil Co., Ltd.) were blended to prepare a resin composition of NCF-B. The resin composition was coated on Polyethylene Terephthalate (PET), which was subject to peeling, by a bar coater, and dried for 3 minutes, in an oven, at a temperature of 80 degrees C. Thereby, NCF-B having a predetermined thickness (cover peeled PET [25 μm]/NCF/base peeled PET [50 μm]) was fabricated. As shown in Table 1, a lowest melting viscosity attainment temperature of NCF-B was 135 degrees C. Further, melting viscosity at a mounting temperature was 1450 Pa·s.

(NCF-C)

13.7 parts by mass of phenoxy resin (product name: PKHH, made by Union Carbide Corporation); 20.6 parts by mass of epoxy resin (product name: HP7200H, made by DIC Corporation); 12.1 parts by mass of acid anhydride (product name: MH-700, made by New Japan Chemical Co., Ltd.); 0.10 parts by mass of imidazole (product name: 2MZ-A, made by SHIKOKU CHEMICALS CORPORATION); 3.3 parts by mass of acrylic resin (product name: DCP, made by Shin-Nakamura Chemical Co., Ltd.); 0.2 parts by mass of organic peroxide (product name: Perbutyl Z, made by NOF Corporation); 44.6 parts by mass of filler (product name: SO-E2, made by Admatechs Company Limited); 5.5 parts by mass of filler (product name: Aerosil RY200, made by Nippon Aerosil Co., Ltd.) were blended to prepare a resin composition of NCF-C. The resin composition was coated on Polyethylene Terephthalate (PET), which was subject to peeling, by a bar coater, and dried for 3 minutes, in an oven, at a temperature of 80 degrees C. Thereby, NCF-C having a predetermined thickness (cover peeled PET [25 μm]/NCF/base peeled PET [50 μm]) was fabricated. As shown in Table 1, a lowest melting viscosity attainment temperature of NCF-C was 130 degrees C. Further, melting viscosity at a mounting temperature was 1460 Pa·s.

(NCF-D)

13.7 parts by mass of phenoxy resin (product name: PKHH, made by Union Carbide Corporation); 15.1 parts by mass of epoxy resin (product name: HP7200H, made by DIC Corporation); 8.9 parts by mass of acid anhydride (product name: MH-700, made by New Japan Chemical Co., Ltd.); 0.08 parts by mass of imidazole (product name: 2MZ-A, made by SHIKOKU CHEMICALS CORPORATION); 11.6 parts by mass of acrylic resin (product name: DCP, made by Shin-Nakamura Chemical Co., Ltd.); 0.6 parts by mass of organic peroxide (product name: Perbutyl Z, made by NOF Corporation); 44.6 parts by mass of filler (product name: SO-E2, made by Admatechs Company Limited); 5.5 parts by mass of filler (product name: Aerosil RY200, made by Nippon Aerosil Co., Ltd.) were blended to prepare a resin composition of NCF-D. The resin composition was coated on Polyethylene Terephthalate (PET), which was subject to peeling, by a bar coater, and dried for 3 minutes, in an oven, at a temperature of 80 degrees C. Thereby, NCF-D having a predetermined thickness (cover peeled PET [25 μm]/NCF/base peeled PET [50 μm]) was fabricated. As shown in Table 1, a lowest melting viscosity attainment temperature of NCF-D was 120 degrees C. Further, melting viscosity at a mounting temperature was 1480 Pa·s.

(NCF-E)

13.7 parts by mass of phenoxy resin (product name: PKHH, made by Union Carbide Corporation); 22.7 parts by mass of epoxy resin (product name: HP7200H, made by DIC Corporation); 13.4 parts by mass of acid anhydride (product name: MH-700, made by New Japan Chemical Co., Ltd.); 0.11 parts by mass of imidazole (product name: 2MZ-A, made by SHIKOKU CHAEMICALS CORPORATION); 41.8 parts by mass of filler (product name: SO-E2, made by Admatechs Company Limited); 8.2 parts by mass of filler (product name: Aerosil RY200, made by Nippon Aerosil Co., Ltd.) were blended to prepare a resin composition of NCF-E. The resin composition was coated on Polyethylene Terephthalate (PET), which was subject to peeling, by a bar coater, and dried for 3 minutes, in an oven, at a temperature of 80 degrees C. Thereby, NCF-E having a predetermined thickness (cover peeled PET [25 μm]/NCF/base peeled PET [50 μm]) was fabricated. As shown in Table 1, a lowest melting viscosity attainment temperature of NCF-E was 135 degrees C. Further, melting viscosity at a mounting temperature was 3200 Pa·s.

TABLE 1

| Classification | Product Name | A | B | C | D | E |
|---|---|---|---|---|---|---|
| Phenoxy resin | PKHH | 13.7 | 13.7 | 13.7 | 13.7 | 13.7 |
| Epoxy resin | HP7200H | 13.7 | 22.7 | 20.6 | 15.1 | 22.7 |
| Acid anhydride | MH-700 | 8.1 | 13.4 | 12.1 | 8.9 | 13.4 |
| Imidazole | 2MZ-A | 0.07 | 0.11 | 0.10 | 0.08 | 0.11 |
| Acrylic resin | DCP | 13.7 | — | 3.3 | 11.6 | — |
| Organic peroxide | Perbutyl Z | 0.7 | — | 0.2 | 0.6 | — |
| Filler | SO-E5 | 44.6 | — | — | — | — |
|  | SO-E2 | — | 44.5 | 44.5 | 44.5 | 41.8 |
|  | Aerozil RY200 | 5.5 | 5.5 | 5.5 | 5.5 | 8.2 |
| Total |  | 100 | 100 | 100 | 100 | 100 |
| Lowest melting viscosity attainment temperature (° C.) |  | 118 | 135 | 130 | 120 | 135 |
| Melting viscosity at mounting temperature (100° C.)(Pa · s) |  | 1500 | 1450 | 1460 | 1480 | 3200 |

Example 1

(Fabrication of Circuit Connecting Material)

NCF-A was used as a first adhesive layer and NCF-B was used as a second adhesive layer, and they were laminated by means of a roll laminator. In this way, an underfill film having a double structure composed of NCF-A (Ha1=25 μm)/NCF-B (Ha2=25 μm) was fabricated.

(Fabrication of Mounting Body)

The first adhesive layer side of the underfill film was stuck on a wafer by means of a press machine, under the conditions of 50 degrees C. and 0.5 MPa, and diced to fabricate an IC chip having a solder-adhered electrode.

The IC chip is 7 mm in size and has a thickness of 200 μm, and has a vamp (φ30 μm, 85 μm pitch, 280 pins) of peripheral arrangement, in which a solder (Sn-3.5Ag, melting point 221 degrees C.) is formed at a tip of an electrode made of Cu.

Further, like the IC chip, an IC substrate opposing thereto is 7 mm in size and has a thickness of 200 μm, and has a vamp (φ30 μm, 85 μm pitch, 280 pins) of peripheral arrangement, in which an electrode made of Cu is formed.

In a cross-sectional view shown in FIG. 1, a thickness He1 of the electrode 12 of the semiconductor chip 10 corresponding to the IC chip was 20 μm, and a thickness Hs of the solder 13 was 16 μm. Further, a thickness He2 of the electrode 32 of the circuit board 30 corresponding to the IC chip was 20 μm. Moreover, a thickness Ha1 of the first adhesive layer 21 was 25 μm, and a thickness Ha2 of the second adhesive layer 22 was 25 μm.

In other words, a reference thickness value in Example 1 was 0.5×He1=10, He1+0.75×Hs=32, 0.25×Hs+He2=24, 0.5×He1+Hs+He2=46. This revealed that a thickness Hb1 of the first adhesive layer, during mounting, was within a range 10 μm or more and 32 μm or less.

Next, as shown in FIG. 2, the IC chip was mounted on the IC substrate, on the conditions of 100 degrees C., 2 sec, and 10N, by a flip chip bonder, so as to come to a state where the solder 13 of the semiconductor 10 contacts the electrode 32 of the circuit board 30. Then, the thickness Hb1 of the first adhesive layer was measured during mounting.

After that, the IC chip and the IC substrate were thermo compression bonded by means of the flip chip bonder, on the conditions of 230 degrees C., 20 sec, and 30N, after having heated and pressed, on the conditions of 150 degrees C., 5 sec, and 10N. Moreover, they are cured on the conditions of 150 degrees C. and 2 hours to fabricate a mounting body. For the mounting body, evaluations of the wettability, the conduction resistance, and the void were conducted, as mentioned above.

In this connection, a temperature, when using the flip chip bonder, is obtained by measuring an actual temperature of a sample.

(Evaluation Results)

The evaluation results of Example 1 were shown in Table 2. Table 2 shows that a maximum value of a ratio between melting viscosity of the first adhesive layer and that of the second adhesive layer was 70, and that a ratio between melting viscosity η1 of the first adhesive layer and melting viscosity η2 of the second adhesive layer, at a mounting temperature (100 degrees C.), was 1.03. Table 2 further shows that the thickness Hb1 of the first adhesive layer, during mounting, was 25 μm, and that evaluation results of the solder wettability of the mounting body was ⊚, the conduction resistance was ⊚, and the void was ○.

Example 2

(Fabrication of Circuit Connecting Material)

NCF-A was used as a first adhesive layer and NCF-C was used as a second adhesive layer, and they were laminated by means of a roll laminator. In this way, an underfill film having a double structure composed of NCF-A (Ha1=25 μm)/NCF-C(Ha2=25 μm) was fabricated.

(Fabrication of Mounting Body)

Other than the underfill film, a mounting body was fabricated in the same manner as Example 1. Namely, in a cross-sectional view shown in FIG. 1, a thickness He1 of the electrode 12 of the semiconductor chip 10 was 20 μm, and a thickness Hs of the solder 13 was 16 μm. Further, a thickness He2 of the electrode 32 of the circuit board 30 was 20 μm. Moreover, a thickness Ha1 of the first adhesive layer 21 was 25 μm, and a thickness Ha2 of the second adhesive layer 22 was 25 μm.

(Evaluation Results)

The evaluation results of Example 2 are shown in Table 2. Table 2 shows that a maximum value of a ratio between melting viscosity of the first adhesive layer and that of the second adhesive layer was 12, and that a ratio between melting viscosity η1 of the first adhesive layer and melting viscosity η2 of the second adhesive layer, at a mounting temperature (100 degrees C.), was 1.03. Table 2 further shows that the thickness Hb1 of the first adhesive layer, during mounting, was 25 μm, and that evaluation results of the solder wettability of the mounting body was ⊚, the conduction resistance was ⊚, and the void was ⊚.

Example 3

(Fabrication of Circuit Connecting Material)

NCF-A was used as a first adhesive layer and NCF-B was used as a second adhesive layer, and they were laminated by means of a roll laminator. In this way, an underfill film having a double structure composed of NCF-A (Ha1=15 μm)/NCF-B (Ha2=35 μm) was fabricated.

(Fabrication of Mounting Body)

Other than the underfill film, a mounting body was fabricated in the same manner as Example 1. Namely, in a cross-sectional view shown in FIG. 1, a thickness He1 of the electrode 12 of the semiconductor chip 10 was 20 μm, and a thickness Hs of the solder 13 was 16 μm. Further, a thickness He2 of the electrode 32 of the circuit board 30 was 20 μm. Moreover, a thickness Ha1 of the first adhesive layer 21 was 15 μm, and a thickness Ha2 of the second adhesive layer 22 was 35 μm.

(Evaluation Results)

The evaluation results of Example 3 are shown in Table 2. Table 2 shows that a maximum value of a ratio between melting viscosity of the first adhesive layer and that of the second adhesive layer was 70, and that a ratio between melting viscosity $\eta 1$ of the first adhesive layer and melting viscosity $\eta 2$ of the second adhesive layer, at a mounting temperature (100 degrees C.), was 1.03. Table 2 further shows that the thickness Hb1 of the first adhesive layer, during mounting, was 15 μm, and that evaluation results of the solder wettability of the mounting body was ⊚, the conduction resistance was ⊚, and the void was ○.

Example 4

(Fabrication of Circuit Connecting Material)

NCF-A was used as a first adhesive layer and NCF-B was used as a second adhesive layer, and they were laminated by means of a roll laminator. In this way, an underfill film having a double structure composed of NCF-A (Ha1=30 μm)/NCF-B (Ha2=20 μm) was fabricated.

(Fabrication of Mounting Body)

Other than the underfill film, a mounting body was fabricated in the same manner as Example 1. Namely, in a cross-sectional view shown in FIG. 1, a thickness He1 of the electrode 12 of the semiconductor chip 10 was 20 μm, and a thickness Hs of the solder 13 was 16 μm. Further, a thickness He2 of the electrode 32 of the circuit board 30 was 20 μm. Moreover, a thickness Ha1 of the first adhesive layer 21 was 30 μm, and a thickness Ha2 of the second adhesive layer 22 was 20 μm.

(Evaluation Results)

The evaluation results of Example 4 are shown in Table 2. Table 2 shows that a maximum value of a ratio between melting viscosity of the first adhesive layer and that of the second adhesive layer was 70, and that a ratio between melting viscosity $\eta 1$ of the first adhesive layer and melting viscosity $\eta 2$ of the second adhesive layer, at a mounting temperature (100 degrees C.), was 1.03. Table 2 further shows that the thickness Hb1 of the first adhesive layer, during mounting, was 30 and that evaluation results of the solder wettability of the mounting body was ⊚, the conduction resistance was ⊚, and the void was ○.

Example 5

(Fabrication of Circuit Connecting Material)

NCF-A was used as a first adhesive layer and NCF-E was used as a second adhesive layer, and they were laminated by means of a roll laminator. In this way, an underfill film having a double structure composed of NCF-A (Ha1=40 μm)/NCF-E (Ha2=30 μm) was fabricated.

(Fabrication of Mounting Body)

Other than the underfill film, a mounting body was fabricated in the same manner as Example 1. Namely, in a cross-sectional view shown in FIG. 1, a thickness He1 of the electrode 12 of the semiconductor chip 10 was 20 μm, and a thickness Hs of the solder 13 was 16 μm. Further, a thickness He2 of the electrode 32 of the circuit board 30 was 20 μm. Moreover, a thickness Ha1 of the first adhesive layer 21 was 40 μm, and a thickness Ha2 of the second adhesive layer 22 was 30 μm.

(Evaluation Results)

The evaluation results of Example 5 are shown in Table 2. Table 2 shows that a maximum value of a ratio between melting viscosity of the first adhesive layer and that of the second adhesive layer was 70, and that a ratio between melting viscosity $\eta 1$ of the first adhesive layer and melting viscosity $\eta 2$ of the second adhesive layer, at a mounting temperature (100 degrees C.), was 0.47. Table 2 further shows that the thickness Hb1 of the first adhesive layer, during mounting, was 15 μm, and that evaluation results of the solder wettability of the mounting body was ⊚, the conduction resistance was ⊚, and the void was ○.

Example 6

(Fabrication of Circuit Connecting Material)

NCF-A was used as a first adhesive layer and NCF-D was used as a second adhesive layer, and they were laminated by means of a roll laminator. In this way, an underfill film having a double structure composed of NCF-A (Ha1=25 μm)/NCF-D (Ha2=25 μm) was fabricated.

(Fabrication of Mounting Body)

Other than the underfill film, a mounting body was fabricated in the same manner as Example 1. Namely, in a cross-sectional view shown in FIG. 1, a thickness He1 of the electrode 12 of the semiconductor chip 10 was 20 μm, and a thickness Hs of the solder 13 was 16 μm. Further, a thickness He2 of the electrode 32 of the circuit board 30 was 20 μm. Moreover, a thickness Ha1 of the first adhesive layer 21 was 25 μm, and a thickness Ha2 of the second adhesive layer 22 was 25 μm.

(Evaluation Results)

The evaluation results of Example 6 are shown in Table 2. Table 2 shows that a maximum value of a ratio between melting viscosity of the first adhesive layer and that of the second adhesive layer was 4, and that a ratio between melting viscosity $\eta 1$ of the first adhesive layer and melting viscosity $\eta 2$ of the second adhesive layer, at a mounting temperature (100 degrees C.), was 1.01. Table 2 further shows that the thickness Hb1 of the first adhesive layer, during mounting, was 25 μm, and that evaluation results of the solder wettability of the mounting body was ○, the conduction resistance was ⊚, and the void was ⊚.

Example 7

(Fabrication of Circuit Connecting Material)

NCF-A was used as a first adhesive layer and NCF-B was used as a second adhesive layer, and they were laminated by means of a roll laminator. In this way, an underfill film having a double structure composed of NCF-A (Ha1=10 μm)/NCF-B (Ha2=40 μm) was fabricated.

(Fabrication of Mounting Body)

Other than the underfill film, a mounting body was fabricated in the same manner as Example 1. Namely, in a cross-sectional view shown in FIG. 1, a thickness He1 of the electrode 12 of the semiconductor chip 10 was 20 μm, and a thickness Hs of the solder 13 was 16 μm. Further, a thickness He2 of the electrode 32 of the circuit board 30 was 20 μm. Moreover, a thickness Ha1 of the first adhesive layer 21 was 10 μm, and a thickness Ha2 of the second adhesive layer 22 was 40 μm.

(Evaluation Results)

The evaluation results of Example 7 are shown in Table 2. Table 2 shows that a maximum value of a ratio between melting viscosity of the first adhesive layer and that of the second adhesive layer was 70, and that a ratio between melting viscosity η1 of the first adhesive layer and melting viscosity η2 of the second adhesive layer, at a mounting temperature (100 degrees C.), was 1.03. Table 2 further shows that the thickness Hb1 of the first adhesive layer, during mounting, was 10 μm, and that evaluation results of the solder wettability of the mounting body was ◯, the conduction resistance was ◎, and the void was ◯.

the semiconductor chip 10 was 20 μm, and the thickness Hs of the solder 13 was 16 μm. Further, the thickness He2 of the electrode 32 of the circuit board 30 was 20 μm. Moreover, the thickness Ha1 of the first adhesive layer 21 was 25 μm, and the thickness Ha2 of the second adhesive layer 22 was 25 μm.

(Evaluation Results)

The evaluation results of Comparative Example 1 are shown in Table 3. Table 3 shows that a maximum value of a ratio between melting viscosity of the first adhesive layer and that of the second adhesive layer was 0.045, and that a ratio between melting viscosity η1 of the first adhesive layer and melting viscosity η2 of the second adhesive layer, at a mounting temperature (100 degrees C.), was 0.97. Table 3 further shows that the thickness Hb1 of the first adhesive layer, during mounting, was 25 μm, and that evaluation results of the wettability of the mounting body was X, the conduction resistance was X, and the void was ◯.

Comparative Example 2

(Fabrication of Circuit Connecting Material)

NCF-A was used as the first adhesive layer and NCF-B was used as the second adhesive layer, and they were laminated by

TABLE 2

| | | Example 1 | Example 2 | Example 3 | Example 4 | Example 5 | Example 6 | Example 7 |
|---|---|---|---|---|---|---|---|---|
| First adhesive layer (NCF1) | | A | A | A | A | A | A | A |
| Second adhesive layer (NCF2) | | B | C | B | B | E | D | B |
| NCF1 lowest melting viscosity attainment temperature | T1 (° C.) | 118 | 118 | 118 | 118 | 118 | 118 | 118 |
| NCF2 lowest melting viscosity attainment temperature | T2 (° C.) | 135 | 130 | 135 | 135 | 135 | 120 | 135 |
| Maximum value of NCF1 melting viscosity/NCF2 melting viscosity ratio | | 70 | 12 | 70 | 70 | 70 | 4 | 70 |
| Mounting temperature (° C.) | | | | | 100 | | | |
| NCF1 melting viscosity during mounting | η 1 (Pa · s) | 1500 | 1500 | 1500 | 1500 | 1500 | 1500 | 1500 |
| NCF2 melting viscosity during mounting | η 2 (Pa · s) | 1450 | 1460 | 1450 | 1450 | 3200 | 1480 | 1450 |
| Melting viscosity ratio during mounting | η 1/η 2 | 1.03 | 1.03 | 1.03 | 1.03 | 0.47 | 1.01 | 1.03 |
| NCF1 thickness | Ha1 (μm) | 25 | 25 | 15 | 30 | 40 | 25 | 10 |
| NCF2 thickness | Ha2 (μm) | 25 | 25 | 35 | 20 | 30 | 25 | 40 |
| Total of NCF thickness | Ha1 + Ha2 (μm) | 50 | 50 | 50 | 50 | 70 | 50 | 50 |
| Electrode thickness of first semiconductor chip | He1 (μm) | | | | 20 | | | |
| Electrode thickness of second semiconductor chip | He2 (μm) | | | | 20 | | | |
| Solder thickness | Hs (μm) | | | | 16 | | | |
| Total of electrode thickness | He1 + He2 (μm) | | | | 40 | | | |
| Reference thickness value | 0.5 × He1 (μm) | | | | 10 | | | |
| | He1 + 0.75 × Hs (μm) | | | | 32 | | | |
| | 0.25 × Hs + He2 (μm) | | | | 24 | | | |
| | 0.5 × He1 + Hs + He2 (μm) | | | | 46 | | | |
| Position of NCF1/NCF2 interface (NCF1 thickness during mounting) (μm) | | 25 | 25 | 15 | 30 | 15 | 25 | 10 |
| Solder melting point (Sn—3.5Ag) (° C.) | | | | | 221 | | | |
| Heating temperature during thermo compression bonding (° C.) | | | | | 230 | | | |
| Evaluation of solder wettability | | ◎ | ◎ | ◎ | ◎ | ◎ | ◯ | ◯ |
| Evaluation of conduction resistance | | ◎ | ◎ | ◎ | ◎ | ◎ | ◎ | ◎ |
| Evaluation of void | | ◯ | ◎ | ◯ | ◯ | ◯ | ◎ | ◯ |

Comparative Example 1

(Fabrication of Circuit Connecting Material)

NCF-B was used as the first adhesive layer and NCF-A was used as the second adhesive layer, and they were laminated by means of a roll laminator. In this way, an underfill film having a double structure NCF-B composed of (Ha1=25 μm)/NCF-A (Ha2=25 μm) was fabricated.

(Fabrication of Mounting Body)

Other than the underfill film, a mounting body was fabricated in the same manner as Example 1. In a cross-sectional view shown in FIG. 1, the thickness He1 of the electrode 12 of means of a roll laminator. In this way, an underfill film having a double structure composed of NCF-A (Ha1=5 μm)/NCF-B (Ha2=45 μm) was fabricated.

(Fabrication of Mounting Body)

Other than the underfill film, a mounting body was fabricated in the same manner as Example 1. In a cross-sectional view shown in FIG. 1, the thickness He1 of the electrode 12 of the semiconductor chip 10 was 20 μm, and the thickness Hs of the solder 13 was 16 μm. Further, the thickness He2 of the electrode 32 of the circuit board 30 was 20 μm. Moreover, the thickness Ha1 of the first adhesive layer 21 was 5 μm, and the thickness Ha2 of the second adhesive layer 22 was 45 μm.

(Evaluation Results)

The evaluation results of Comparative Example 2 are shown in Table 3. Table 3 shows that a maximum value of a ratio between melting viscosity of the first adhesive layer and that of the second adhesive layer was 70, and that a ratio between melting viscosity η1 of the first adhesive layer and melting viscosity η2 of the second adhesive layer, at a mounting temperature (100 degrees C.), was 1.03. Table 3 further shows that the thickness Hb1 of the first adhesive layer, during mounting, was 5 μm, and that evaluation results of the wettability of the mounting body was X, the conduction resistance was X, and the void was ○.

Comparative Example 3

(Fabrication of Circuit Connecting Material)

NCF-A was used as the first adhesive layer and NCF-B was used as the second adhesive layer, and they were laminated by means of a roll laminator. In this way, an underfill film having a double structure composed of NCF-A (Ha1=40 μm)/NCF-B (Ha2=10 μm) was fabricated.

(Fabrication of Mounting Body)

Other than the underfill film, a mounting body was fabricated in the same manner as Example 1. In a cross-sectional view shown in FIG. 1, the thickness He1 of the electrode 12 of the semiconductor chip 10 was 20 μm, and the thickness Hs of the solder 13 was 16 μm. Further, the thickness He2 of the electrode 32 of the circuit board 30 was 20 μm. Moreover, the thickness Ha1 of the first adhesive layer 21 was 40 μm, and the thickness Ha2 of the second adhesive layer 22 was 10 μm.

(Evaluation Results)

The evaluation results of Comparative Example 3 are shown in Table 3. Table 3 shows that a maximum value of a ratio between melting viscosity of the first adhesive layer and that of the second adhesive layer was 70, and that a ratio between melting viscosity η1 of the first adhesive layer and melting viscosity η2 of the second adhesive layer, at a mounting temperature (100 degrees C.), was 1.03. Table 3 further shows that the thickness Hb1 of the first adhesive layer, during mounting, was 40 μm, and that evaluation results of the wettability of the mounting body was X, the conduction resistance was X, and the void was ○.

Comparative Example 4

(Fabrication of Circuit Connecting Material)

NCF-A was used as the first adhesive layer and NCF-E was used as the second adhesive layer, and they were laminated by means of a roll laminator. In this way, an underfill film having a double structure composed of NCF-A (Ha1=20 μm)/NCF-E (Ha2=50 μm) was fabricated.

(Fabrication of Mounting Body)

Other than the underfill film, a mounting body was fabricated in the same manner as Example 1. In a cross-sectional view shown in FIG. 1, the thickness He1 of the electrode 12 of the semiconductor chip 10 was 20 μm, and the thickness Hs of the solder 13 was 16 μm. Further, the thickness He2 of the electrode 32 of the circuit board 30 was 20 μm. Moreover, the thickness Ha1 of the first adhesive layer 21 was 20 μm, and the thickness Ha2 of the second adhesive layer 22 was 50 μm.

(Evaluation Results)

The evaluation results of Comparative Example 4 are shown in Table 3. Table 3 shows that a maximum value of a ratio between melting viscosity of the first adhesive layer and that of the second adhesive layer was 22, and that a ratio between melting viscosity η1 of the first adhesive layer and melting viscosity η2 of the second adhesive layer, at a mounting temperature (100 degrees C.) was 0.47. Table 3 further shoes that the thickness Hb1 of the first adhesive layer, during mounting, was 2 μm, and that evaluation results of the wettability of the mounting body was X, the conduction resistance was X, and the void was ○.

Comparative Example 5

(Fabrication of Circuit Connecting Material)

NCF-A was used as the first adhesive layer and NCF-B was used as the second adhesive layer, and they were laminated by means of a roll laminator. In this manner, an underfill film having a double structure composed of NCF-A (Ha1=25 μm)/NCF-B (Ha2=25 μm) was fabricated.

(Fabrication of Mounting Body)

Other than the underfill film and thermo compression bonding on the conditions of 200 degrees C., 20 sec, and 30N, after having heated and pressed, on the conditions of 150 degrees C., 5 sec, and 10N, a mounting body was fabricated in the same manner as Example 1. Namely, in a cross-sectional view shown in FIG. 1, the thickness He1 of the electrode 12 of the semiconductor chip 10 was 20 μm, and the thickness Hs of the solder 13 was 16 μm. Further, the thickness He2 of the electrode 32 of the circuit board 30 was 20 μm. Moreover, the thickness Ha1 of the first adhesive layer 21 was 25 μm, and the thickness Ha2 of the second adhesive layer 22 was 25 μm.

(Evaluation Results)

The evaluation results of Comparative Example 5 are shown in Table 3. Table 3 shows that a maximum value of a ratio between melting viscosity of the first adhesive layer and that of the second adhesive layer was 70, and that a ratio between melting viscosity η1 of the first adhesive layer and melting viscosity η2 of the second adhesive layer, at a mounting temperature (100 degrees C.) was 1.03. Table 3 further shows that the thickness Hb1 of the first adhesive layer, during mounting, was 25 μm, and that evaluation results of the wettability of the mounting body was X, the conduction resistance was X, and the void was ○.

PRIOR ART (Fabrication of Circuit Connecting Material)

An underfill film having a single layer of NCF-A (thickness 50 μm) was fabricated.

(Fabrication of Mounting Body)

Other than the underfill film, a mounting body was shown in the same manner as Example 1. Namely, in a cross-sectional view shown in FIG. 1, the thickness He1 of the electrode 12 of the semiconductor chip 10 was 20 μm, and the thickness Hs of the solder 13 was 16 μm. Further, the thickness He2 of the electrode 32 of the circuit board 30 was 20 μm.

(Evaluation Results)

The evaluation results of the prior art are shown in Table 3. Table 3 shows that the evaluation results of the wettability of the mounting body was X, the conduction resistance was X, and the void was ⊚.

TABLE 3

|  | | Comparative Example | Comparatve Example | Comparative Example | omparatve Example | Comparative Example | Prior Art |
|---|---|---|---|---|---|---|---|
| First adhesive layer (NCF1) | | B | A | A | A | A | A |
| Second adhesive layer (NCF2) | | A | B | B | E | B | |
| NCF1 lowest melting viscosity attainment temperature | T1 (° C.) | 135 | 113 | 113 | 118 | 118 | 118 |
| NCF2 lowest melting viscosity attainment temperature | T2 (° C.) | 113 | 135 | 135 | 135 | 135 | |
| Maximum value of NCF1 melting viscosity/NCF2 melting viscosity ratio | | 0.045 | 70 | 70 | 22 | 70 | — |
| Mounting temperature (° C.) | | | | | 100 | | |
| NCF1 melting viscosity during mounting | η 1 (Pa · s) | 1450 | 1500 | 1500 | 1500 | 1500 | 1500 |
| NCF2 melting viscosity during mounting | η 2 (Pa · s) | 1500 | 1450 | 1450 | 3200 | 1450 | |
| Melting viscosity ratio during mounting | η 1/η 2 | 0.97 | 1.03 | 1.03 | 0.47 | 1.03 | — |
| NCF1 thickness | Ha1 (μm) | 25 | 5 | 40 | 20 | 25 | 50 |
| NCF2 thickness | Ha2 (μm) | 25 | 45 | 10 | 50 | 25 | |
| Total of NCF thickness | Ha1 + Ha2 (μm) | 50 | 50 | 50 | 70 | 50 | |
| Electrode thickness of first semiconductor chip | He1 (μm) | | | | 20 | | |
| Electrode thickness of second semiconductor chip | He2 (μm) | | | | 20 | | |
| Solder thickness | Hs (μm) | | | | 16 | | |
| Total of electrode thickness | He1 + He2 (μm) | | | | 40 | | |
| Reference thickness value | 0.5 × He1 (μm) | | | | 10 | | |
| | He1 + 0.75 × Hs (μm) | | | | 32 | | |
| | 0.25 × Hs + He2 (μm) | | | | 24 | | |
| | 0.5 × He1 + Hs + He2 (μm) | | | | 46 | | |
| Position of NCF1/NCF2 interface (NCF1 thickness during mounting) (μm) | | 25 | 5 | 40 | 2 | 25 | — |
| Solder melting point (Sn—3.5Ag) (° C.) | | | | | 221 | | |
| Heating temperature during thermo compression bonding (° C.) | | | 230 | | | 200 | 230 |
| Evaluation of solder wettability | | X | X | X | X | X | X |
| Evaluation of conduction resistance | | X | X | X | X | X | X |
| Evaluation of void | | ○ | ○ | ○ | ○ | ○ | ◎ |

Since in Comparative Example 1, a lowest melting viscosity attainment temperature T2 of the second adhesive layer was lower than a lowest melting viscosity attainment temperature T1 of the first adhesive layer, and it cannot satisfy an inequality of T1<T2, a solder did not wet spread to the opposing electrode, and a failure occurred that there existed a terminal whose conduction resistance was open after the Temperature Cycling Test (TCT).

Comparative Example 2 is a case where a ratio of melting viscosity η1 of the first adhesive layer and melting viscosity η2 of the second adhesive layer, at a mounting temperature (100 degrees C.), is 0.8 or more. Since the thickness Ha1 of the first adhesive layer, before mounting, is smaller than a reference thickness value, the thickness Hb1 of the first adhesive layer, after mounting, becomes unable to satisfy the formula (1). In Comparative Example 2, a solder did not wet spread to the opposing electrode, and a failure occurred that there existed a terminal whose conduction resistance was open after the Temperature Cycling Test (TCT).

Comparative Example 3 is a case where a ratio of melting viscosity η1 of the first adhesive layer and melting viscosity η2 of the second adhesive layer, at a mounting temperature (100 degrees C.) is 0.8 or more. Since the thickness Ha1 of the first adhesive layer, before mounting, is larger than a reference thickness value, the thickness Hb1 of the first adhesive layer, after mounting, becomes unable to satisfy the formula (1). In Comparative Example 3, a solder did not wet spread to the opposing electrode, a failure occurred that there existed a terminal whose conduction resistance was open after the Temperature Cycling Test (TCT).

Comparative Example 4 is a case where a ratio of melting viscosity η1 of the first adhesive layer and melting viscosity η2 of the second adhesive layer, at a mounting temperature (100 degrees C.), is 0.6 or less. Since the thickness Ha2 of the second adhesive layer, before mounting, is larger than a reference thickness value, the thickness Hb1 of the first adhesive layer, after mounting, becomes unable to satisfy the formula (1). On this account, in Comparative Example 4, a solder did not wet spread to the opposing electrode, a failure occurred that there existed a terminal whose conduction resistance was open after the Temperature Cycling Test (TCT).

Since in Comparative Example 5, a heating temperature, during pressure bonding, is lower than a melting point of the solder, a solder did not wet spread to the opposing electrode, and a failure occurred that there existed a terminal whose conduction resistance was open after the Temperature Cycling Test (TCT).

Since in the prior art, a solder does not wet spread to the opposing electrode, a failure occurred that there existed a terminal whose conduction resistance became an was open after the Temperature Cycling Test (TCT).

Meanwhile, Examples 1 to 4, 6 and 7 are cases where a ratio of melting viscosity η1 of the first adhesive layer and melting viscosity η2 of the second adhesive layer, at a mounting temperature (100 degrees C.), is 0.8 or more. Since the thickness Ha1 of the first adhesive layer, before mounting, is within a range of the reference thickness value, the thickness Hb1 of the first adhesive layer, after mounting, became able to satisfy the formula (1). On this account a solder sufficiently wet spread to the opposing electrode, and there existed a terminal whose conduction resistance was open after the Temperature Cycling Test (TCT).

Example 5 is a case where a ratio of melting viscosity η1 of the first adhesive layer and melting viscosity rη2 of the second adhesive layer, at a mounting temperature (100 degrees C.), is 0.6 or less. Since the thickness Ha2 of the second adhesive layer, before mounting, is within a range of a reference thickness value, the thickness Hb1 of the first adhesive layer, after mounting, became able to satisfy the formula (1). On this account, a solder sufficiently wet spread to the opposing electrode, and there existed no terminal whose conduction resistance was open after the Temperature Cycling Test (TCT).

Besides in Examples 2 and 6, the both of the first adhesive layer and the second adhesive layer cause two types of curing reactions, that is, epoxy-based and radical-based curing reactions. Thus, it was successful in preventing the occurrence of void, even when these layers are rapidly heated, for example, to a temperature where a difference between a mounting temperature and a highest attainment temperature, during pressure bonding, is 70 degrees C. or more.

REFERENCE SIGN LIST

1 . . . wafer
2 . . . underfill film
3 . . . jig
4 . . . blade
10 . . . semiconductor chip
11 . . . semiconductor
12 . . . electrode
13 . . . solder
20 . . . circuit connecting material
21 . . . first adhesive layer
22 . . . second adhesive layer
30 . . . circuit board
31 . . . base material
32 . . . opposing electrode

The invention claimed is:

1. A circuit connecting material for bonding a semiconductor chip in which a solder-adhered electrode is formed and a circuit board on which an opposing electrode opposite to the solder-adhered electrode is formed,
wherein a first adhesive layer to be adhered to the semiconductor chip side, and a second adhesive layer having a lowest melting viscosity attainment temperature higher than that of the first adhesive layer are laminated, and
when the semiconductor chip on which the circuit connecting material is stuck is mounted on the circuit board, at a temperature lower than the lowest melting viscosity attainment temperature of the first adhesive layer, a thickness Hb1 of the first adhesive layer is within a range satisfying the following formula (1):

$$0.5 \times He1 \leq Hb1 \leq He1 + 0.75 \times Hs \quad \text{formula (1)}$$

where He1 denotes an electrode thickness of the solder-adhered electrode, and Hs denotes a solder thickness of the solder-adhered electrode.

2. The circuit connecting material according to claim 1, wherein
when the semiconductor chip in which the circuit connecting material is stuck is mounted on the circuit board, at a temperature lower than the lowest melting viscosity attainment temperature of the first adhesive layer, the thickness Hb1 of the first adhesive layer is within a range satisfying the following formula (2):

$$0.75 \times He1 \leq Hb1 \leq He1 + 0.75 \times Hs \quad \text{formula (2)}$$

where He1 denotes an electrode thickness of the solder-adhered electrode, and Hs denotes a solder thickness of the solder-adhered electrode.

3. The circuit connecting material according to claim 1, wherein a maximum value of a ratio between melting viscosity of the first adhesive layer and that of the second adhesive layer is 10 or more.

4. The circuit connecting material according to claim 1, wherein the first adhesive layer and the second adhesive layer contain a film formation resin, an epoxy resin, an epoxy curing agent, an acrylic resin, and radical polymerization initiator.

5. The circuit connecting material according to claim 1, wherein when a ratio ($\eta1/\eta2$) between melting viscosity $\eta1$ of the first adhesive layer and melting viscosity $\eta2$ of the second adhesive layer is 0.8 or more, at a temperature at which the semiconductor chip is mounted on the circuit board, a thickness Ha1 of the first adhesive layer and the thickness Ha2 of the second adhesive layer, before mounting, are within a range satisfying the following formula (3-1) and formula (3-2):

$$0.5 \times He1 \leq Ha1 \leq He1 + 0.75 \times Hs \quad \text{formula (3-1)}$$

$$He1 + He2 \leq Ha1 + Ha2 \quad \text{formula (3-2)}$$

where He1 denotes an electrode thickness of the solder-adhered electrode, Hs denotes a solder thickness of the solder-adhered electrode, and He2 denotes an electrode thickness of the opposing electrode.

6. The circuit connecting material according to claim 1, wherein
when a ratio ($\eta1/\eta2$) of melting viscosity $\eta1$ of the first adhesive layer and melting viscosity $\eta2$ of the second adhesive layer is 0.6 or less, at a temperature at which the semiconductor chip is mounted on the circuit board, a thickness Ha2 of the second adhesive layer, before mounting, is within a range satisfying the following formula (4-1) to formula (4-3):

$$0.5 \times He1 \leq Ha1 \quad \text{formula (4-1)}$$

$$0.25 \times Hs + He2 \leq Ha2 \leq 0.5 \times He1 + Hs + He2 \quad \text{formula (4-2)}$$

$$He1 + He2 \leq Ha1 + Ha2 \quad \text{formula (4-3)}$$

where He1 denotes an electrode thickness of the solder-adhered electrode, Hs denotes a solder thickness of the solder-adhered electrode, and He2 denotes an electrode thickness of the opposing electrode.

7. A semiconductor device manufacturing method for bonding a semiconductor chip in which a solder-adhered electrode is formed and a circuit board on which an opposing electrode opposite to the solder-adhered electrode is formed via a circuit connecting material in which a first adhesive layer to be adhered to the semiconductor chip side, and a second adhesive layer having a lowest melting viscosity attainment temperature higher than that of the first adhesive layer are laminated, the method comprises:
a mounting step of mounting the semiconductor chip in which the circuit connecting material is stuck on the circuit board, at a temperature lower than a lowest melting viscosity attainment temperature of the first adhesive layer, a thickness Hb1 of the first adhesive layer being within a range satisfying the following formula (1); and
a thermo compression bonding step of thermo compression bonding the semiconductor chip and the circuit board, at a temperature higher than a melting point of a solder of the solder-adhered electrode, $$0.5 \times He1 \leq Hb1 \leq He1 + 0.75 \times Hs \quad \text{formula (1)}$$

where He1 denotes an electrode thickness of the solder-adhered electrode, and Hs denotes a solder thickness of the solder-adhered electrode.

8. A semiconductor device manufacturing method according to claim 7, further comprising:
- a sticking step of sticking the circuit connecting material to a wafer; and
- a cutting step of cutting the wafer into individual semiconductor chips by dicing the wafer.

9. A semiconductor device manufacturing method for bonding a plurality of chip substrates having a first surface on which a solder-adhered electrode is formed, and a second surface on which an opposing electrode opposite to the solder-adhered electrode is formed are laminated via a circuit connecting material in which a first adhesive layer to be adhered to the first surface side, and a second adhesive layer having a lowest melting viscosity attainment temperature higher than that of the first adhesive layer are laminated, wherein the method comprises:
- a mounting step of mounting the first surface of the first chip substrate on which the circuit connecting material is stuck on the second surface of the second chip substrate, at a temperature lower than the lowest melting viscosity attainment temperature of the first adhesive layer, a thickness Hb1 of the first adhesive layer being within a range satisfying the following formula (1); and
- a thermo compression bonding step of thermo compression bonding the first surface of the first chip substrate and the second surface of the second chip substrate, at a temperature higher than a melting point of a solder of the solder-adhered electrode, $$0.5 \times He1 \leq Hb1 \leq He1 + 0.75 \times Hs \qquad \text{formula (1)}$$

where He1 denotes an electrode thickness of the solder-adhered electrode, and Hs denotes a solder thickness of the solder-adhered electrode.

* * * * *